United States Patent [19]

Kullander et al.

[11] 4,282,289

[45] Aug. 4, 1981

[54] METHOD OF PREPARING COATED CEMENTED CARBIDE PRODUCT AND RESULTING PRODUCT

[75] Inventors: Gregor H. Kullander, Älvsjö; Christopher G. Chatfield, Stockholm; Marian Mikůs, Skärholmen; Bo K. Westergren, Hägersten, all of Sweden

[73] Assignee: Sandvik Aktiebolag, Sandviken, Sweden

[21] Appl. No.: 140,804

[22] Filed: Apr. 16, 1980

[51] Int. Cl.$^3$ ............................................. C23C 11/08
[52] U.S. Cl. ................... 428/457; 148/16.5; 148/16.6; 148/31.5; 427/249; 427/419.2; 427/419.7
[58] Field of Search ................ 427/249, 419.2, 419.7; 482/457, 472; 148/16.5, 16.6, 31.5

[56] References Cited

U.S. PATENT DOCUMENTS

| | | | |
|---|---|---|---|
| 3,564,683 | 2/1971 | Schedler | 29/95 |
| 3,736,107 | 5/1973 | Hale | 428/539 |
| 3,836,392 | 9/1974 | Lux et al. | 428/335 |
| 3,837,896 | 9/1974 | Lindstrom et al. | 428/336 |
| 4,018,631 | 4/1977 | Hale | 417/249 |

*Primary Examiner*—Ralph S. Kendall
*Attorney, Agent, or Firm*—Burns, Doane, Swecker & Mathis

[57] ABSTRACT

An improved process for the production of coated cemented carbide products is disclosed. A cemented carbide substrate is treated to form a metal carbide, nitride or carbonitride coating. During the last part of this treatment or subsequent thereto, a sulfur-and/or nitrogen-containing gas is added to the atmosphere to form a sulfide-and/or nitride - containing layer on the coating. Thereafter, a wear-resistant oxide (e.g., aluminum oxide) coating is applied to form the improved coated cemented carbide product.

6 Claims, No Drawings

METHOD OF PREPARING COATED CEMENTED CARBIDE PRODUCT AND RESULTING PRODUCT

The present invention relates to cemented carbide bodies having at least one thin, extremely wear resistant surface layer and to a method of making such products. More particularly, it relates to such coated cemented carbide products in which a layer of aluminum oxide or other wear resistant oxide is firmly bonded to the substrate.

It heretofore was known that an improved wear resistance can be obtained in hard metal (cemented carbide) bodies, for example, cutting inserts, by applying a surface layer of wear resistant oxide upon a substrate of conventional sintered hard metal containing at least one carbide together with a binder metal (see, for example, U.S. Pat. Nos. 3,736,107 and 3,836,392). Usually, the thin layer has been applied by deposition from a gaseous phase (e.g., Chemical Vapor Deposition or "CVD" technique), but several other methods have been proposed.

Disturbances from the substrate (and from the material in the reactor vessel, etc.) may obstruct the formation of layers having a satisfactory structure (morphology) and binding ability to the substrate if an oxide layer is applied directly upon the hard metal. Therefore, further development steps have been performed in order to give the products improved properties, suited for the commercial market.

It heretofore was known that desired results could be obtained by the utilization in such composites of different kinds of intermediate layers, for example, one or more layers of carbides, carbonitrides and/or nitrides of Ti, Zr, Hf, V, Nb, Ta, Cr, Mo, W, Si and/or B (see, for example, U.S. Pat. No. 3,837,896). In said patent, belonging to the same assignee as the present application, it was noted that neither of the layers contains a binder metal. Other known cemented carbide products consist of laminated layers of different hard metal grades. Such other known cemented carbide products were prepared by conventional pressing and sintering techniques and contained therefore considerable amounts of binder metal (see, for example, British Pat. Nos. 1,042,711, 1,115,908 and 1,118,362). Thus, the statement in U.S. Pat. No. 3,837,896 that the coatings should be free from binder metal was not meant to exclude certain inclusions or small contents of mainly Co and W or WC that can be present in the intermediate layer. The essential feature of the invention of U.S. Pat. No. 3,837,896 is that the intermediate layer serves as a barrier to "catch" the mentioned elements, etc., and prevent their diffusion through the layer so that harmful influences upon the oxide layer from these constituents of the substrate can be avoided at the sites of nucleation and/or the growth of the oxide layer. By these means, a coherent and continuous carbide or nitride layer free from binder metal can be obtained at least in a zone immediately below the oxide layer.

It was also known that improved adherence of oxide coatings on cemented carbide substrates could be obtained by a method comprising certain heat treatment and oxidizing steps (see, for example, U.S. Pat. No. 4,018,631). In this method there was a combination of essentially four different steps (I)–(IV):

(I) Forming on the cemented carbide substrate (containing W and Co) a coating comprising a material selected from carbide, nitride, carbonitride and mixtures thereof of metal selected from Ti, Ta, Hf, Zr, Nb and mixtures thereof.

(II) Diffusing W and Co into said coating by heating the product at a temperature greater than the melting point of the Co phase.

(III) Oxidizing said coating.

(IV) Applying an oxide layer.

All these steps were known, either separately or in certain combinations, in connection with coatings on cemented carbide. Thus, the commercial product covered by the earlier mentioned U.S. Pat. No. 3,837,896 is a combination of the steps (I) and (IV). Furthermore, there is mentioned in the specification of said U.S. patent (see, for example, Column 3, lines 52–57) that also the step (III) may be utilized. Finally, the heat treatment of coated cemented carbide at an increased temperature, i.e., step (II), was disclosed in the earlier mentioned U.S. Pat. No. 3,836,392 (see, for example, Column 2, lines 38–45). The said U.S. Pat. No. 3,836,392 was in turn indirectly referred to in the specification, Column 1, lines 25–47, of U.S. Pat. No. 3,837,896, both patents now belonging to the same assignee.

It has now been found that new and improved results can be obtained by a certain modification of some of these known steps and utilization of these steps in conjunction with other treating steps. It has now also been found, quite surprisingly, that further, considerable improvements in use and adherence can be achieved if the above substrate is treated in a different manner prior to applying the wear-resistant oxide coating and particularly if the mentioned oxidizing step is avoided.

The advantages which might be expected from the earlier mentioned known process which includes oxidation of the surface of the coated cemented carbide, would at first sight appear to be a result of the formation of a compound on that surface which is related to the wear resistant oxide applied afterwards. It has been found, however, that the oxidation of the intermediate layer, for example, in the case of a titanium carbide coating, from TiC to TiO, $TiO_2$ or other oxide or oxycarbide (realizing that corresponding compounds containing nitrogen can also be formed if nitrogen is present) causes an expansion of the volume of the layer which can give rise to cracks in the layer. There are, however, different ways of avoiding the mentioned oxidizing step, as will be mentioned in the following, and by these means it is possible to obtain further advantages in the final product.

In accordance with the present invention there is provided a method of treating a cemented carbide substrate containing at least one carbide together with binder metal in order to improve its wear resistance and utility, which method consists essentially of: (a) treating the substrate in an atmosphere selected from carbide, nitride and carbonitride forming atmospheres to form or apply a coating essentially consisting of at least one coat of at least one member selected from the group consisting of carbides, nitrides and carbonitrides of the elements Ti, Zr, Hf, Nb, Ta, Cr, Mo, W, Si and B; (b) adding a sulfur-and/or nitrogen-containing gas at the end of or at a period during the treatment of step (a) to form a sulfide and/or nitride portion on or in said coating; and (c) applying a wear resistant oxide coating on the thus pretreated cemented carbide substrate. If desired, the coated substrate of step (a) and/or (b) may be heat-treated in a step (d) at a temperature close to or greater than the melting point of the binder phase in order to diffuse elements from the substrate into the coating.

The first step (a), by which surface coatings of carbide, nitride or carbonitride (preferably titanium carbide, titanium nitride) are formed or applied, can be performed in several different ways. Besides a usual method which is deposition from a gaseous phase containing metal halide, hydrogen, hydrocarbon and possibly nitrogen (CVD technique), a layer can be applied by pack-cementing and/or resintering. In the last instance, the metal or the hard element (for example TiC) is taken from the substrate. This latter instance is equivalent to the treatment of the substrate according to the steps (a)+(b)+(d) or (a)+(d) as one operation in which the metal or metals forming the actual carbide, nitride and/or carbonitride are diffused from the interior of the substrate to the surface where they are being enriched by using a reactive gas. In this case, the cemented carbide in the substrate has to contain at least some $\gamma$ (gamma)-phase carbide, i.e., it has to contain at least some of the carbide in the form of a cubic carbide such as TiC, TaC, NbC, etc. Thus, there is obtained a (gamma)-phase zone at the surface of the substrate and the application of a surface layer (according to the step (a) or (a)+(b)) and the recrystallization and growth of the grains of the layer (being obtained in the process according to the step (d)) can be substituted by a single process step. Because of said grain growth, the diffusion of metals as W and Co from the substrate through the coating is impeded to a great extent as this diffusion takes place essentially along the grain boundaries.

It has also been found that a surface having a great micro-roughness can be obtained in the last mentioned treatment because of the grain growth and/or the recrystallization, which means an enlarged area of contact and possibilities of "hook-binding" or otherwise adhering the following oxide layer applied according to the step (c) to the substrate.

A method of enriching titanium carbide to the surface of cemented carbide containing $\gamma$ (gamma)-phase by packing processes at sintering temperature was, however, known per se (see, for example, U.S. Pat. No. 3,564,683, Example 5, in which packing of cemented carbide in $TiO_2$ and graphite at 1350° C. is described). Also other similar processes were known (see, for example, British patent specification No. 1,506,915) in which a surface layer of carbide was obtained on a cemented carbide body by treatment of the body with carbon monoxide. By said treatment, the concentration of carbide was caused to be greater in the surface layer than within the remainder of the body.

As mentioned earlier, however, it is the special combination of the various steps of the present invention that is essential for obtaining new results, and unexpected, in the final product.

Also the heat treatment e.g., in a carbon-containing furnace, according to step (d) which is generally conducted in a non-reactive (prior to or after the addition of the sulfur-and/or nitrogen-containing compound) atmosphere such as vacuum, argon, hydrogen and the like at a temperature above the melting point of the matrix binder metal (in the case of cobalt, a temperature of from about 1200° to 1600° C.) for a time sufficient to diffuse the metal from the substrate to the coating (usually from about 5 minutes up to about 3 hours or longer) can preferably be performed at a high temperature within that range such that a certain conversion of the crystals in the coating of carbide, etc., is obtained. This increased temperature of diffusion will cause a formation of a micro-rough surface offering the same possibilities and advantages as mentioned in the foregoing.

The surface coating of carbide, etc., according to step (a) can be applied under such circumstances and at such a supersaturation that short whiskers, coarse grains, ellipsoidal plates, etc., of the carbide, etc., are formed. Suitable conditions for formation of whiskers can be obtained at a carefully adjusted, relatively low supersaturation. ("Supersaturation" or over-saturation is present when the initial concentrations of reactants (including reactants (e.g., carbon) coming from the substrate) and products, ordered as in an equilibrium equation, are smaller than the equilibrium concentrations ordered in an analogous way). (See for example "Proceedings of the Conference on Chem. Vap. Dep. of Refr. Metals, Alloys and Compounds" (1967) USA, page 3).

In order to clean the hard metal bodies or if a certain amount of the binder metal such as cobalt, or if a tungsten phase has penetrated to the outermost part of the surface layer during the heat treatment, an etching operation can be efficiently utilized. By etching as for example with HCl, possibly in a gaseous phase (in $H_2$), the binder metal is removed. Furthermore, the etching can be effective in the formation of a micro-rough surface. Tungsten and/or tungsten carbide can be removed in a similar way by selective etchants. By the concurrent addition of $H_2$ to the etching gas there is also obtained a reduction of cobalt oxide and tungsten oxide which may possibly be present and whose formation can cause cracking.

When the treatment of the substrate according to the step (a) is performed in a gaseous phase by CVD-technique, a gas containing one or more sulfur-and/or nitrogen-containing compounds is added at the end of or at a period during the coating process and in this way cause the sulfur and/or nitrogen to be taken up in the layer in a natural order. The addition of these elements to the intermediate layer causes a further improved adherence to the outer oxide layer particularly, when the step (a) treatment was performed without using any chlorine or chlorine compounds in the gaseous phase.

The nitride and/or sulfide partial outer layer may also be applied by nitriding and/or sulfiding the substrate by conventional techniques known in the art, e.g., utilizing mixtures of $CS_2 + H_2$ which forms a sulfide on the outer layer or a mixture containing nitrogen, e.g., a nitrogen oxide and $H_2$, which forms a nitride on the outer layer. This method is especially efficient when especially good protection is sought to prevent cobalt diffusion from the substrate.

In any event, the nitriding or sulfiding of the first layer is performed such that no more than about 70% of the first layer is sulfided or nitrided.

The outer, wear-resistant oxide (e.g., aluminum or zirconium oxide) maybe applied to the treated substrate in accordance with known techniques such as, for example, those set forth in U.S. Pat. Nos. 3,836,392 and 3,837,896.

The invention is additionally illustrated in connection with the following Examples which are to be considered as illustrative of the present invention. It should be understood, however, that the invention is not limited to the specific details of the Examples.

EXAMPLE 1

A batch of 300 cemented carbide cutting inserts (type SPUN 120308), having a composition in % by weight:

86% WC, 5.5% Co and the remainder cubic carbides (TaC, NbC and TiC) is heated to 1030° C. and treated for about 30 minutes with mixtures of $CO_2 + H_2$ containing from 1 to 10% $CO_2$.

After this treatment, the inserts are coated with TiC by CVD-technique in a conventional CVD-pilot plant. The deposition process was performed at 1030° C. and 20 Torr. The gas contained 4% $CH_4$ and 4% $TiCl_4$, the remainder being essentially $H_2$. There was obtained a coating of TiC with a thickness of 1–2 μm. The coating time was relatively short, about 1 hour. During the last 15 minutes of the coating time, a sulfur-containing gas ($CS_2$) is added in an amount of 1 percent by volume to form a solid solution of titanium carbide and titanium sulfide.

The inserts are then coated with $Al_2O_3$ by treatment in a gaseous phase at a temperature of 1030° C. and a pressure of 50 torr. In the gaseous phase, 3% $AlCl_3$ is added to a $H_2/CO_2$-mixture adjusted so that the content of $H_2O$ at the inserts was about 0.002% of the content of $H_2$. Examinations in a light microscope show that the 4–5 μm thick $Al_2O_3$-coating is reinforced to the substrate by small outgrowths of TiC and the solid solution with excellent bonding and no signs of crack formations.

As a result of the heat treatment mentioned above, some of the cutting inserts showed an enrichment of the binder metal (e.g., cobalt) on the surface of the inserts where the cobalt diffused from the interior of the substrate. As the presence of cobalt will negatively affect the adherence to the surface layer of oxide applied later on, most of the cobalt present in the surface zone is efficiently removed by etching the inserts with a $H_2 + HCl$-mixture containing 0.1–10% HCl. It is found that the substrate (including the TiC-layer) becomes more rough and irregular because of the treatment. It is observed in similar tests that this irregular surface of the substrate gives an improved adherence of the oxide layer.

EXAMPLE 2

Another batch of the cemented carbide cutting inserts of Example 1 is coated with TiC by CVD-technique as in Example 1 except that the inserts are not heat-treated prior to coating. During the last part (i.e., last 15 minutes) of the coating time, a sulfur-containing gas is added as in Example 1 to form on the surface a solid solution of titanium carbide and titanium sulfide. The inserts are then coated with $Al_2O_3$. The bonding between the substrate and the $Al_2O_3$ coating is excellent. No crack formation between the $Al_2O_3$ coating and the substrate can be found.

EXAMPLE 3

The procedure of Example 2 is repeated except that a nitrogen-containing gas is added to the CVD-atmosphere during the last 15 minutes of the coating time instead of the sulfur-containing gas to form a titanium carbide and titanium nitride solid solution.

EXAMPLE 4

A batch of 300 cemented carbide cutting inserts (type SPUN 120308) having the same composition as in Example 1 is coated with TiC by CVD-techniques in the same way as in Example 1. The coating time is relatively short, about 1 hour. During the last 20 minutes of the deposition time, 1 v/o propane and 2.5 v/o HCl are added to obtain a coarse grain size in the coating surface. During the last 10 minutes of the deposition time, carbon disulfide in an amount of 0.3 v/o is added to form titanium carbide and titanium sulfide coating. The inserts are then coated with $Al_2O_3$ as in Example 1. The resulting inserts show excellent adherence of the coatings with no crack formation between coating and substrate.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. Method of treating a cemented carbide substrate containing at least one carbide together with binder metal in order to improve its wear resistance and utility, which method consists essentially of:
   (a) treating the substrate in an atmosphere selected from carbide, nitride and carbonitride forming atmospheres to form or apply a coating essentially consisting of at least one coat of at least one member selected from the group consisting of carbides, nitrides and carbonitrides of the elements Ti, Zr, Hf, V, Nb, Ta, Cr, Mo, W, Si and B;
   (b) adding a sulfur-and/or nitrogen containing gas at the end of or at a period during the treatment of step (a) to form a sulfide and/or nitride portion on said coating; and
   (c) applying a wear resistant oxide coating on the thus pretreated cemented carbide substrate.

2. The method of claim 1 wherein the treated cemented carbide substrate is heat treated by a further step (d) at a temperature close to or greater than the melting point of the binder metal phase prior to step (c).

3. The method of claim 2, wherein the treatment of the substrate according to the steps (a), (b)+(d) is performed as one operation, in which the member of the metals of the substrate forming the carbide, nitride and carbonitride is brought to diffuse from the interior of the substrate out to the surface.

4. The method of claims 2 or 3, wherein at least part of the binder metal which has diffused to the outermost part of the surface coating during the heat treatment step is removed by means of selective etchants.

5. The method of claim 4, wherein the selective etchant is a mixture of HCl and $H_2$.

6. The product of the process of claim 1.

* * * * *